(12) United States Patent
Nemirovsky et al.

(10) Patent No.: US 6,645,787 B2
(45) Date of Patent: Nov. 11, 2003

(54) GAMMA RAY DETECTOR

(75) Inventors: Yael Nemirovsky, Haifa (IL); Raoul Weil, Haifa (IL); Robert Beserman, Haifa (IL); Joseph Shamir, Haifa (IL); Sara Stolyarova, Haifa (IL); Arye Peyser, Jerusalem (IL)

(73) Assignee: Technion Research and Development Foundation Ltd., Haifa (IL)

( * ) Notice: Subject to any disclaimer, the term of this patent is extended or adjusted under 35 U.S.C. 154(b) by 0 days.

(21) Appl. No.: 10/051,069

(22) Filed: Jan. 22, 2002

(65) Prior Publication Data

US 2003/0138987 A1 Jul. 24, 2003

(51) Int. Cl.$^7$ ............................................. H01L 21/00
(52) U.S. Cl. ................................... 438/56; 250/370.13
(58) Field of Search ............................. 438/56, 66, 34

(56) References Cited

U.S. PATENT DOCUMENTS

| | | | | |
|---|---|---|---|---|
| 5,587,585 A | * | 12/1996 | Eisen et al. | 250/370.09 |
| 5,972,782 A | | 10/1999 | Ostapenko | |
| 6,175,120 B1 | * | 1/2001 | McGregor et al. | 250/370.13 |
| 6,252,923 B1 | * | 6/2001 | Iacovino et al. | 376/272 |
| 6,524,966 B1 | * | 2/2003 | Wright et al. | 438/754 |

OTHER PUBLICATIONS

Y. Nemirovsky, G. Asa, J. Gorelik, A. Peyser "Recent Progress in n–Type CdZnTe Arrays for Gamma–Ray Spectroscopy", Nuclear Instrument & Methods, A, 2001, 458, 325–333.*

G. Garyagdiyev, I.Y. Gorodetskii, B.R. Dzhumayev "Mechanism of ultrasound–induced changes in electrical and photoelectric properties of single crystals of ZnCdTe solid solutions" Sov. Phys. Semicond., 1991, 25, 248.*

H.B. Barber "Application of II–VI materials to nuclear medicine", J. Electronic Materials, 1996, 25, 1232.

Y. Nemirovsky, A. Ruzin, G. Asa, J. Gorelik "Study of Charge Collection Efficiency of CdZnTe Radiation Detectors", J. Electronic Materials, 1996, 25, 1221–1231.

Y. Nemirovsky, A. Ruzin, G. Asa, J. Gorelik "Study of Contacts to CdZnTe Radiation Detectors", J. Electronic Materials, 1997, 26, 756–764.

A. Ruzin Y. Nemirovsky "Statistical Models for Charge Collection Efficiency and Variance in Semiconductor Spectrometers", J. Appl. Phys., 1997, 82, 2754–2758.

Y. Nemirovsky, G. Asa, C.G. Jakobson, A. Ruzin, J. Gorelik "Dark Noise Currents and Energy Resolution of CdZnTe Spectrometers", J. Electronic Materials, 1998, 27, 800–806.

Y. Nemirovsky, G. Asa, A. Ruzin, J. Gorelik, R. Sudharsanan "Characterization of Dark Noise in CdZnTe Spectrometers", J. Electronic Materials, 1998, 27, 807–813.

A. Ruzin, Y. Nemirovsky "Methodology for Evaluation of Mobility—Lifetime Product by Spectroscopy Measurements in CdZnTe Spectrometers", J. Appl. Phys., 1997, 82, 4166–4171.

(List continued on next page.)

Primary Examiner—David Nelms
Assistant Examiner—Thao P Le
(74) Attorney, Agent, or Firm—Mark M. Friedman (57) ABSTRACT

A method for improving CdZnTe-based gamma-ray detectors is presented. A CdZnTe detector/crystal is exposed to acoustic waves. After exposure to acoustic waves, the CdZnTe gamma-detector gains higher resistivity and exhibits better spectral resolution and greater sensitivity. Further, when a batch of detectors is made according to the method of the present invention, the properties of the crystals are more homogenous, allowing for cheaper and more standardized detectors.

46 Claims, 8 Drawing Sheets

OTHER PUBLICATIONS

A. Ruzin, Y. Nemirovsky "Passivation and Surface Leakage in CdZnTe Spectrometers", *Appl. Phys. Lett.*, 1997, 71, 2214–2215.

Y. Nemirovsky, G. Gordon, D. Goren "Measurement of Band Offsets and Interface Charges by the C–V Matching Method", *J. Appl. Phys.*, 1998, 84, 1–8.

Y. Nemirovsky "Statistical Modeling of Charge Collection in Semiconductor Gamma–Ray Spectrometers", *J. Appl. Phys.*, 1999, 85, 8–15.

Y. Nemirovsky, M. Iframor, A. Ludwig "The Effect of the Geometrical Parameters on the Electric Field of Pixilated Two–Dimensional Arrays of Gamma–Ray Spectrometers", *J. Appl. Phys.*, 2000, 88, 5388–5394.

Y. Nemirovsky, G. Asa, J. Gorelik, A. Peyser "Recent Progress in n–Type CdZnTe Arrays for Gamma–Ray Spectroscopy", Nuclear Instrument & Methods, A, 2001, 458, 325–333.

M. Ifraimov, A. Ludwig, Y. Nemirovsky "Statistical Modeling of the Spectral Performance of a Two–Dimensional Array of Gamma–Ray Spectrometers" to be published in *J. Appl. Phys.*, 2002.

A.P. Zdebskii, N.V. Mironyuk, S.S. Ostapenko, A.U. Savchuk, M.K. Sheinkman "Mechanism of ultrasound–stimulated changes in photoelectric and luminescence properties of cadmium sulfide" Sov. Phys. Semicond., 1986, 20, 1167.

A.P. Zdebskii, M.I. Lisyanskii, N.B. Lukyanchikov "Effect of ultrasonic processing on the voltage–current and noise characteristics of GaAs tunnel diodes" Sov.Tech.Phys. Lett., 1987, 13, 550.

G. Garyagdiyev, I.Y. Gorodetskii, B.R. Dzhumayev "Mechanism of ultrasound–induced changes in electrical and photoelectric properties of single crystals of Zn Cd Te solid solutions" Sov. Phys. Semicond., 1991, 25, 248.

M. Lisiansky, V. Korchnoi, R. Weil, N. Nemirovsky "Stability of Electrical Parameters of Metalorganic Chemical Vapor Deposition CdTe Layers", J. Phys. D, 1997, 30, 3203–3210.

M.L. Lisiansky, V.L. Korchnoi, A. Berner, E. Muranevich, R. Weil "Improvement of CdTe Substrate Quality by Acoustic Treatment", J. Cryst. Growth, 1999, 197, 630.

F. Edelman, A. Zeckzer, P. Grau, S. Stolyarova, R. Weil, A. Berner, R. Beserman, Y. Nemirovsky "Hardening of $Cd_{1-x}Zn_xTe$ by Acoustic Wave Treatment", submitted to *Physica Status Solidi*, 2002.

* cited by examiner

GAMMA RAY DETECTOR

FIELD AND BACKGROUND OF THE INVENTION

The present invention relates to the manufacture of devices for the detection of high-energy electromagnetic radiation and, more particularly, to a method for providing gamma-ray detectors containing cadmium zinc telluride (CdZnTe) crystals with improved properties.

Gamma-ray detectors have wide applications, for example, in medicine, environmental monitoring and materials testing. As an example, in nuclear medicine a gamma-ray-emitting substance, a radiotracer, is typically injected into the body of a patient. The radiotracer travels through or is concentrated in parts of the body. By detecting the gamma rays emitted by the radiotracer using a gamma ray spectrometer, diagnostically useful information is gained.

Figure 1:
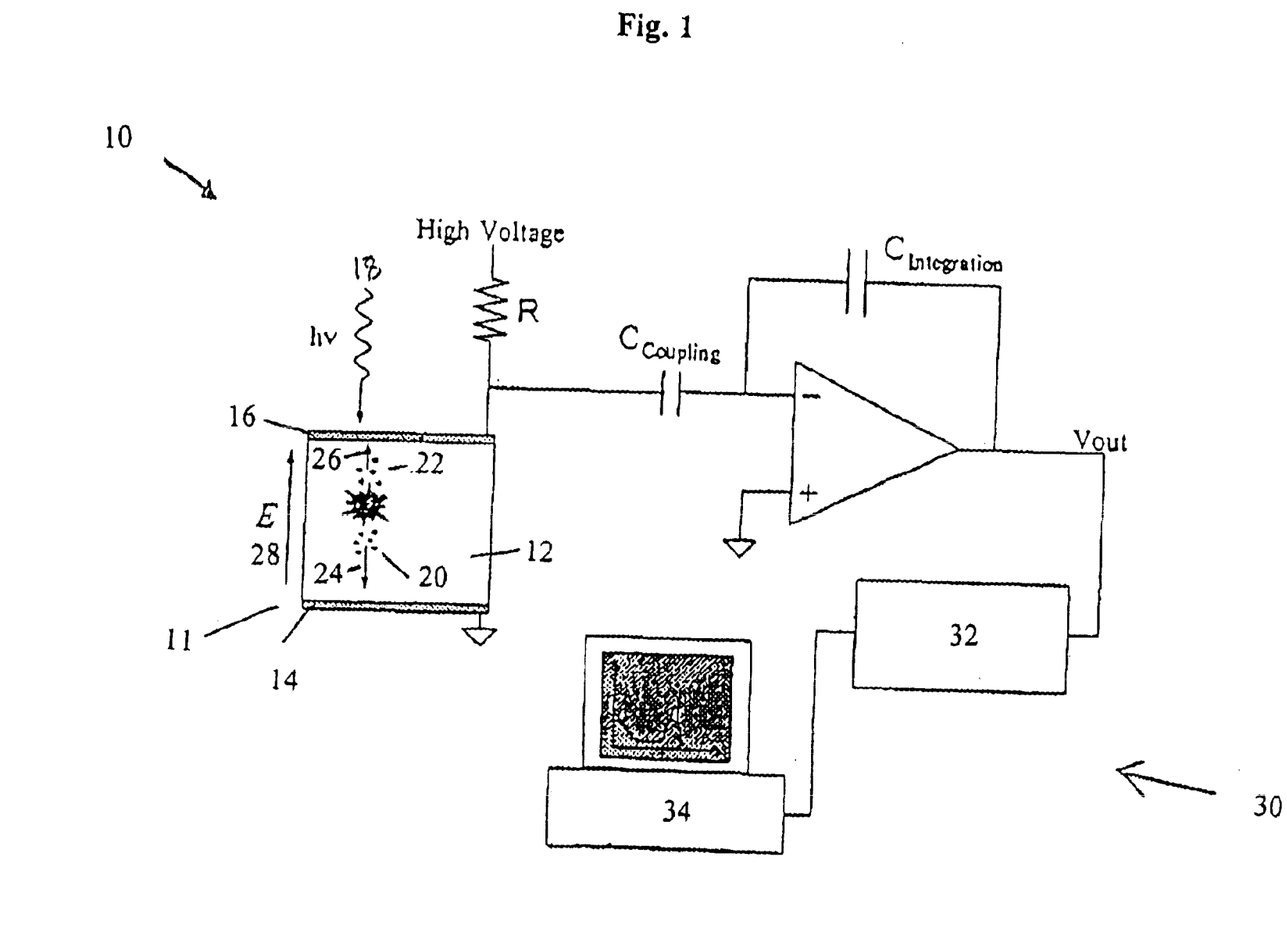
FIG. 1 is a schematic depiction of a gamma-ray spectrometer using a CdZnTe gamma-ray detector.
Figure 2A:
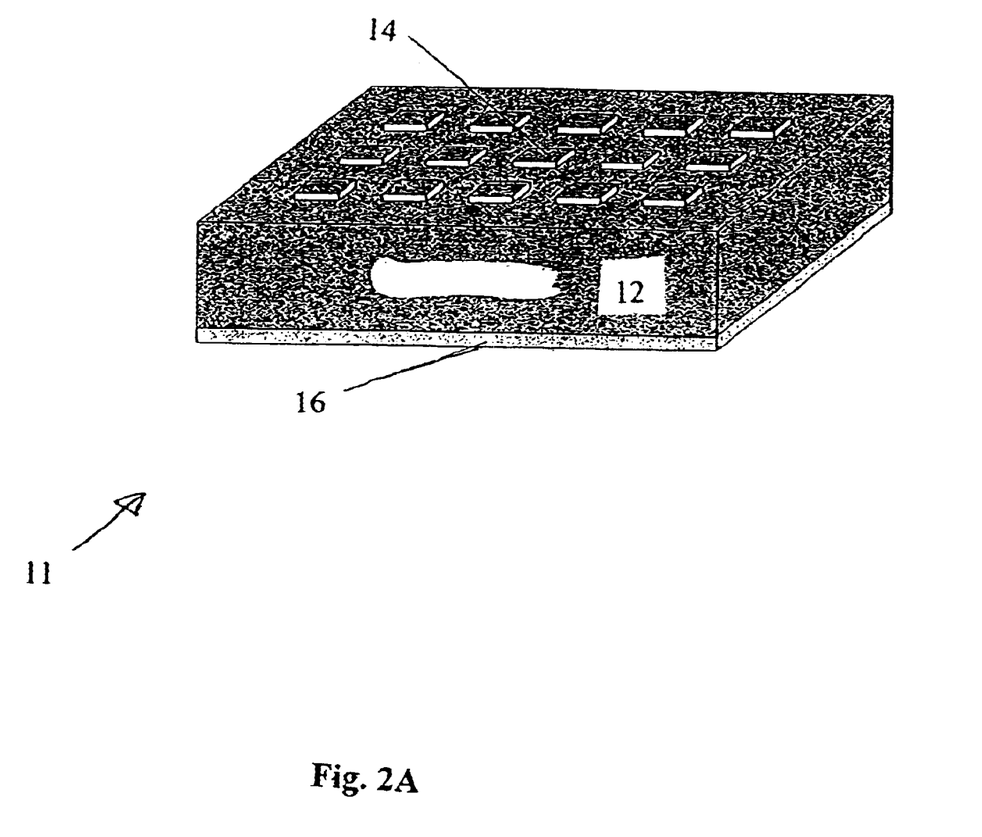
FIG. 2A is a schematic depiction of a CdZnTe gamma-ray detector without a guard ring.
Figure 2B:
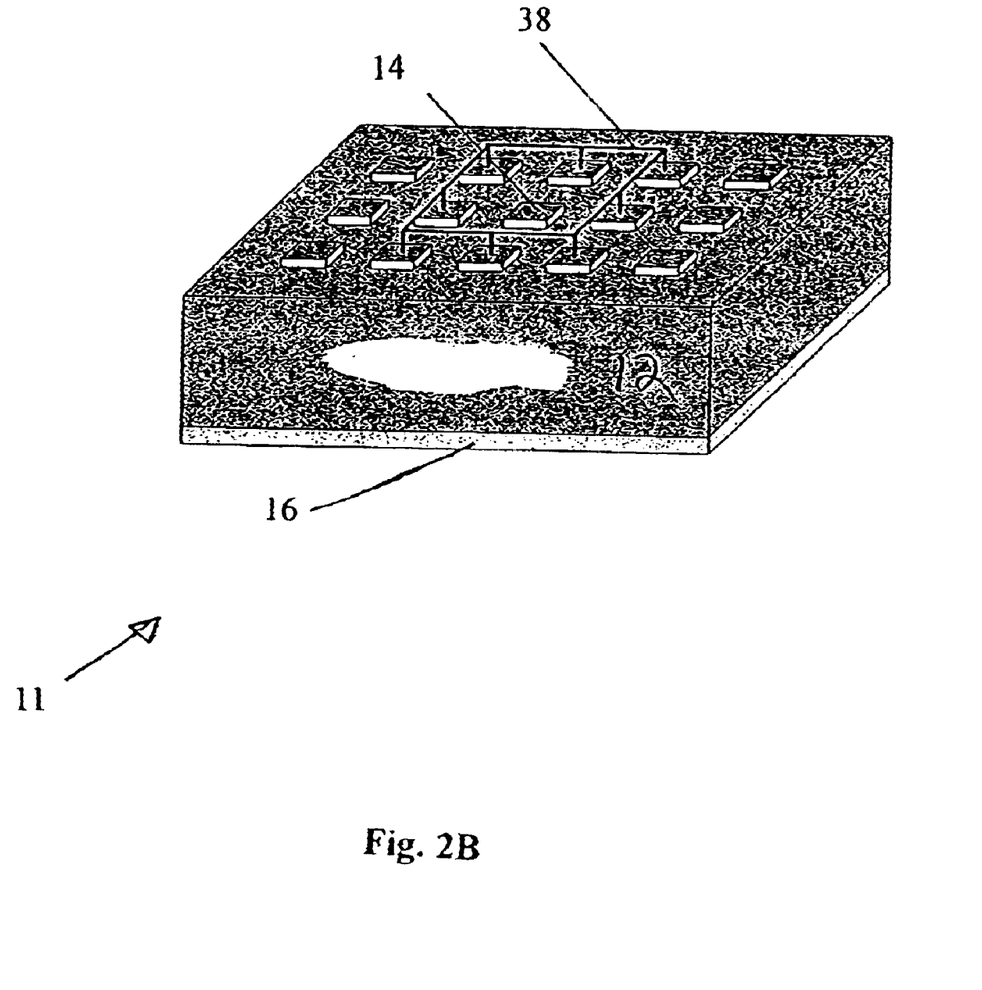
FIG. 2B is a schematic depiction of a CdZnTe gamma-ray detector with a guard ring.

In FIG. 1 a typical gamma-ray spectrometer 10 is depicted. The heart of gamma-ray spectrometer 10 is gamma-ray detector 11. Gamma-ray detector 11 detects and measures the energy of individual photons, such as photon 18. Gamma-ray detectors, such as 11, typically include a semiconductor crystal 12, a forward contact 14 and a backward contact 16. In detector 11, semiconductor crystal 12 is a CdZnTe crystal. A gamma-ray photon 18 interacting with a semiconductor crystal 12 deposits energy in the bulk of semiconductor crystal 12 by ionization to form electron 20 and hole 22 pairs. Once produced, electrons 20 and holes 22 drift in opposite directions (24 and 26, respectively) under the influence of a strong electric field 28 within which semiconductor crystal 12 is found. The output signal of detector 11 is the induced charge corresponding to charge-motion 24 and 26. Read-out electronics 30, including pulse-shaping amplifier 32 and computer equipped multi-channel analyzer 34, allow a spectral distribution (energy distribution) curve to be recorded. In FIG. 2A, detector 11 is depicted in perspective, showing CdZnTe crystal 12, forward contact 14 and backward contact 16. In FIG. 2B, an embodiment of a detector 11 is depicted, where in addition to CdZnTe crystal 12, forward contact 14 and backward contact 16, is a guard ring 38 maintained at the same potential as forward contact 14 so as to reduce surface leakage current.

The parameters important in defining the usefulness of a gamma ray detector for nuclear medicine are spatial resolution, energy resolution and counting efficiency. In order to minimize the exposure of a patient to radiation, it is preferable that only small amounts of radiotracer be injected. As a result, the absolute intensity of gamma-rays that are emitted by the radiotracer to be detected is low. It is thus important that a gamma-ray detector used in nuclear medicine have a high counting efficiency. In addition, the semiconducting crystal used in a gamma-ray detector must be made of a semi-insulating material. As described above and in FIG. 1, a gamma-ray detector must be located in an intense electric field. The intense electric field increases the level of charge collection. However, the typical intensity of an electric field used is such that large dark currents are induced in materials which are even slightly conductive and are thus not categorized as semi-insulating.

Amongst the suitable semiconducting materials used in gamma ray detectors is crystalline Cadmium Zinc Telluride (CdZnTe). Gamma-ray detectors made using CdZnTe have wide band-gaps, high resistivities and allow room-temperature operation.

Further background of radiation detectors in general and CdZnTe detectors in particular can be found in the prior art, for example in references [1–3]. Greater details concerning the specific background relating to CdZnTe detectors can be found in the prior art, for example in references [4–15].

Known semiconducting materials, including CdZnTe crystals, produced in accordance with the methods known in the art contain a large number of defects. The presence of a large number of defects renders a crystal unsuitable for use in a detector. In the first place, the presence of a large number of defects decreases the resistivity of a crystal, leading to high levels of dark current. In the second place, defects lead to charge-carrier trapping. Charge-carrier trapping occurs when charge-carriers become trapped at defects in the crystal and thus contribute only partially to the signal. When charge-carrier trapping occurs, pulse heights are different for different interaction depths resulting in a tailing or plateauing of a photopeak. This tailing or plateauing reduces the energy resolution of the detector and reduces the effective photopeak fraction. For any given energy window, charge-carrier trapping also reduces the detector counting-efficiency.

It would be highly advantageous to have a method for improving CdZnTe crystals and gamma-ray detectors. It would be highly advantageous to be able to supply CdZnTe crystals having a well-defined and predictable low level of defects so that gamma-ray detectors made using the crystals have a good spectral resolution, high sensitivity and low dark current level.

REFERENCES

[1] "Physics in Nuclear Medicine", J. A. Sorenson and M. E. Phelps, Second Edition, W. B. Saunders Company, London (1987).

[2] "Foundation of medical imaging", Z. H. Cho, J. P. Jones and M. Singh, Wiley, N.Y. (1993).

[3] H. B. Barber "Application of II–VI materials to nuclear medicine", J. Electronic Materials, 1996, 25, 1232.

[4] Y. Nemirovsky, A. Ruzin, G. Asa, J. Gorelik "Study of Charge Collection Efficiency of CdZnTe Radiation Detectors", J. Electronic Materials, 1996, 25, 1221–1231.

[5] Y. Nemirovsky, A. Ruzin, G. Asa, J. Gorelik "Study of Contacts to CdZnTe Radiation Detectors", J. Electronic Materials, 1997, 26, 756–764.

[6] A. Ruzin Y. Nemirovsky "Statistical Models for Charge Collection Efficiency and Variance in Semiconductor Spectrometers", J. Appl. Phys., 1997, 82, 2754–2758.

[7] Y. Nemirovsky, G. Asa, C. G. Jakobson, A. Ruzin, J. Gorelik "Dark Noise Currents and Energy Resolution of CdZnTe Spectrometers", J. Electronic Materials, 1998, 27, 800–806.

[8] Y. Nemirovsky, G. Asa, A. Ruzin, J. Gorelik, R. Sudharsanan "Characterization of Dark Noise in CdZnTe Spectrometers", J. Electronic Materials, 1998, 27, 807–813.

[9] A. Ruzin, Y. Nemirovsky "Methodology for Evaluation of Mobility—Lifetime Product by Spectroscopy Measurements in CdZnTe Spectrometers", J. Appl. Phys., 1997, 82, 4166–4171.

[10] A. Ruzin, Y. Nemirovsky "Passivation and Surface Leakage in CdZnTe Spectrometers", Appl. Phys. Lett., 1997, 71, 2214–2215.

[11] Y. Nemirovsky, G. Gordon, D. Goren "Measurement of Band Offsets and Interface Charges by the C-V Matching Method", J. Appl. Phys., 1998, 84, 1–8.

[12] Y. Nemirovsky "Statistical Modeling of Charge Collection in Semiconductor Gamma-Ray Spectrometers", J. Appl. Phys., 1999, 85, 8–15.

[13] Y. Nemirovsky, M. Iframor, A. Ludwig "The Effect of the Geometrical Parameters on the Electric Field of Pixilated Two-Dimensional Arrays of Gamma-Ray Spectrometers", *J. Appl. Phys.,* 2000, 88, 5388–5394.

[14] Y. Nemirovsky, G. Asa, J. Gorelik, A. Peyser "Recent Progress in n-Type CdZnTe Arrays for Gamma-Ray Spectroscopy", *Nuclear Instrument & Methods, A,* 2001, 458, 325–333.

[15] M. Ifraimov, A. Ludwig, Y. Nemirovsky "Statistical Modeling of the Spectral Performance of a Two-Dimensional Array of Gamma-Ray Spectrometers" to be published in *J. Appl. Phys.,* 2002.

[16] A. P. Zdebskii, N. V. Mironyuk, S. S. Ostapenko, A. U. Savchuk, M. K. Sheinkman *Sov. Phys. Semicond.,* 1986, 20, 1167.

[17] A. P. Zdebskii, M. I. Lisyanskii, N. B. Lukyanchikov Sov. Tech. Phys. Lett., 1987, 13, 550.

[18] G. Garyagdiyev, I. Y. Gorodetskii, B. R. Dzhumayev *Sov. Phys. Semicond.,* 1991, 25, 248.

[19] M. Lisiansky, V. Korchnoi, R. Weil, N. Nemirovsky "Stability of Electrical Parameters of Metalorganic Chemical Vapor Deposition CdTe Layers", *J. Phys. D,* 1997, 30, 3203–3210.

[20] M. L. Lisiansky, V. L. Korchnoi, A. Berner, E. Muranevich, R. Weil "Improvement of CdTe Substrate Quality by Acoustic Treatment", *J. Cryst. Growth,* 1999, 197, 630.

[21] F. Edelman, A. Zeckzer, P. Grau, S. Stolyarova, R. Weil, A. Berner, R. Beserman, Y. Nemirovsky "Hardening of $Cd_{1-x}Zn_xTe$ by Acoustic Wave Treatment", submitted to *Physica Status Solidi,* 2002.

SUMMARY OF THE INVENTION

The invention of the present invention includes a method for the improvement of spectral resolution, sensitivity and uniformity of CdZnTe crystals and CdZnTe gamma-ray detectors by reducing defect density using an acoustic wave treatment.

According to the present invention there is provided a method for producing CdZnTe crystals or gamma-ray detectors having a reduced amount of defects by a) taking a CdZnTe crystal or a gamma-ray detector made of a CdZnTe crystal and b) treating it with acoustic waves. The acoustic waves are of low amplitude in order not to cause the production of defects in the crystal or detector, thus the strain amplitude in the transducer should be in the range $10^{-7}$ to $10^{-6}$ m/m. When a CdZnTe crystal is treated according to the method of the present invention, then after the treatment the crystal is integrated into a gamma-ray detector, for example by adding contacts to the crystal according to the methods known in the art.

According to one embodiment of the present invention, the crystal or detector is treated with acoustic waves using a device configured to transfer acoustic waves through a liquid (including liquids, but also suspensions, colloids, gels and the such) and wherein the crystal or detector is immersed in such a liquid.

According to a feature of the present invention, the acoustic waves are applied to a crystal or detector to a face of the crystal, allowing the acoustic waves to propagate perpendicularly to that face.

In order for the acoustic waves to be applied through a face of the treated crystal or detector, it is preferred that the treated crystal or detector be in physical contact with the transducer used to produce the acoustic waves.

According to a feature of the present invention, the crystal or detector is reversibly attached through a face to the transducer. According to a further feature of the present invention, the crystal or detector is reversibly attached to the transducer by means of a removable adhesive such as paraffin or photoresist.

The acoustic waves used are in the range of frequencies between 100 Hz and 10 MHz, preferably ultrasonic acoustic waves. According to a feature of the present invention, it is preferable from the perspective of improved process-control to select a frequency of acoustic waves, which is substantially similar to a resonance frequency of the specific acoustic transducer used. According to a feature of the present invention, a resonance frequency of the transducer-crystal combination (or transducer-detector combination) is determined and that resonance frequency is used according to the method of the present invention.

When ultrasonic waves are used, either shear, compressional or a combination of both waves are used.

According to a feature of the present invention, the crystal or detector can be treated using the acoustic waves at room temperature. According to a still further feature of the present invention the treatment occurs at an elevated temperature of between 20° C. and 80° C. While not wishing to be held to any one theory, it is believed that an elevated temperature can increase the rate of processes responsible for the positive effects of the method of the present invention. It is also believed that an elevated temperature can supply the activation energy necessary to initiate some processes responsible for the positive effects of the method of the present invention.

According to a feature of the present invention, the treatment of the crystal or detector can advantageously occur in the presence of a DC electric field. Those crystal defects carrying a charge are transported from the crystal more quickly than otherwise due to the effect of the DC electric field. According to a feature of the present invention, such an electric field preferable has an intensity of greater than 50 V/cm and of less than 500 V/cm.

The defects and impurities that are removed from the crystal or detector by the method of the present invention are often driven to the outer surfaces of the crystal or detector. Thus, according to a feature of the present invention, after application of the acoustic waves to a crystal or detector, the surfaces of the crystal or detector are treated to remove the defects from the surfaces. One such treatment is etching of the surfaces using a methanolic solution of $Br_2$.

According to a feature of the present invention, after application of the acoustic waves, the crystal or detector is annealed at an elevated temperature of between 30° C. and 90° C. According to a still further feature of the present invention annealing is performed for more than 30 minutes. According to a still further feature of the present invention, annealing is performed for no longer than 2 months.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is a method for the production of improved gamma-ray CdZnTe detectors with heretofore unknown higher sensitivity and greater spectral resolution by treating crystals of CdZnTe with acoustic waves. The principles and application of the method of the present invention may be better understood with reference to the drawings and the accompanying description.

According to one method of the present invention, after an appropriately sized CdZnTe crystal or gamma ray detector has been prepared, the crystal or detector is exposed to acoustic waves. As is well known to one skilled in the art, acoustic vibrations are effectively absorbed by crystal defects such as dislocations, grain boundaries and precipitates. At the same time, such defects serve as gettering sites for contamination impurities. While not wishing to be held to any one theory, it is believed that when acoustic waves are applied to a CdZnTe crystal in accordance with the teachings of the present invention, extended lattice defects efficiently couple and transfer absorbed acoustic energy to point defects. As a consequence, defects are annealed or diffused from the bulk of the crystal, see for example references [16–20].

In the art it is known that the treatment of a CdZnTe crystals with ultrasonic acoustic waves can modify crystal properties. For examples, crystals can be hardened, reference [21], or the level of dark current induced by an electric field can be reduced, reference [18]. However, it is not possible to predict, a priori, the effect of acoustic treatment on a given crystal. For example, CdTe crystals do not become substantially harder when exposed to ultrasonic waves [21].

It is important to note that one skilled in the art could not predict the improvement in detector performance according to the method of the present invention in light of the decrease in dark current effected by the treatment described in reference [21]. The link between the reduction of dark current, i.e. increase of the resistivity of CdZnTe crystal, and CdZnTe gamma-ray detector performance is not trivial since detector performance also depends on other crystal parameters such as the presence of traps for photo-induced carriers. In other words, high resistivity of the CdZnTe crystal is a necessary but not sufficient condition for good detector performance.

Figure 3:
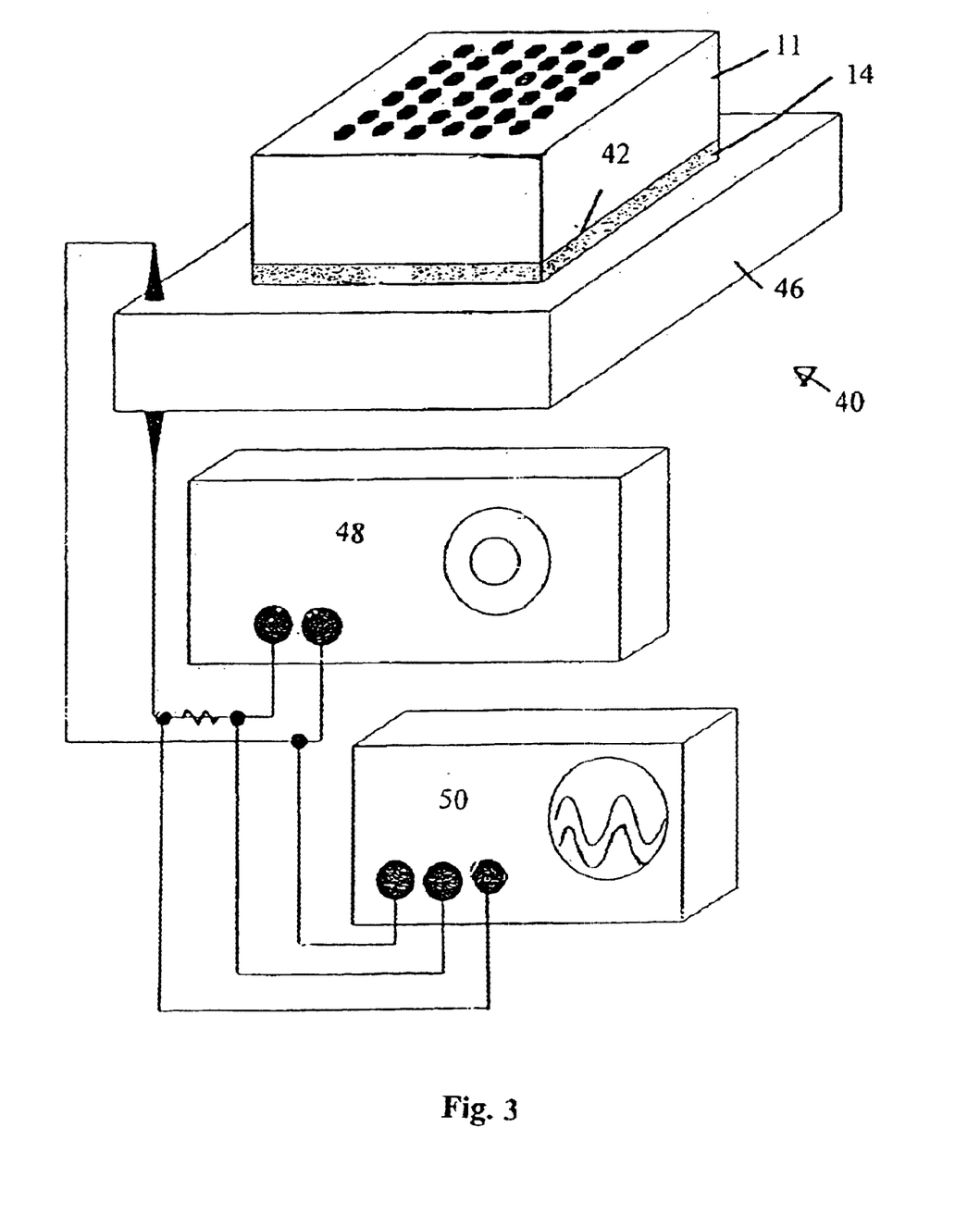
FIG. 3 is a schematic depiction of a CdZnTe detector undergoing acoustic treatment according to the method of the present invention.

In FIG. 3, an embodiment of the present invention is depicted. In FIG. 3, CdZnTe detector 11 is reversibly attached to an acoustic transducer 40 through backside contact face 42. This can be performed, for example, by using a removable adhesive 44, such as paraffin wax or photoresist. Acoustic transducer 40 includes a piezoelectric crystal 46, a frequency generator 48 and a double-trace oscilloscope 50. When transducer 40 is activated, acoustic waves propagate from piezoelectric crystal 46 in a direction perpendicular to backside contact face 42.

According to the teachings of the present invention, any frequency of acoustic waves between 100 Hz and 10 MHz can be applied to the CdZnTe crystal or detector being treated. Either shear waves, compressional waves, or a combination of both types of waves is applied. The type of wave will depend on the frequency applied, as well as on the geometry and type of transducer used. Although an acoustic wave of any frequency can be applied, it is preferable that the frequency of an acoustic wave applied be a resonance frequency of piezoelectric crystal 46. Any given piezoelectric crystal, such as 46, has a unique set of resonance frequencies. The bonding of CdZnTe detector 11 to piezoelectric crystal 46 changes the resonance frequencies. In practice, determining that an applied frequency is resonant can be done by monitoring the current and the voltage applied to piezoelectric crystal 46. In FIG. 4 this is done using double-trace oscilloscope 50 synchronized to either the voltage or the current signal. Resonance is detected by varying the frequency applied by frequency generator 48. When the observed current is in phase with the observed voltage, the applied frequency is resonant. As is clear to one skilled in the art, when a resonance frequency is applied, the acoustic (mechanical) power delivered by piezoelectric crystal 46 to CdZnTe detector 11 can be estimated using the measured current.

When an off-resonance frequency is used, it is difficult to determine the acoustic power delivered by the transducer, because in this case, only the current in phase with the voltage is effective. Thus the use of off-resonance frequencies is disadvantageous from the perspective of controlling a process according to the method of the present invention.

According to the teachings of the present invention, the acoustic waves are applied to CdZnTe detector 11 for any length of time. Needless to say that it is advantageous that the application time be as short as possible. Preferably, application time is optimized for every frequency used. Practically it has been found that the acoustic waves are applied to a CdZnTe crystal or detector from about 10 minutes to about 240 minutes. In general shorter time periods are sufficient when higher frequencies are applied or when treatment is performed at elevated temperatures (30° C.–90° C.). For example, when 1 MHz frequency ultrasonic waves are used, 15 minutes suffice. In contrast, for 70 kHz ultrasonic waves about 60 minutes of exposure are necessary. As is clear to one skilled in the art, excessively long exposure to acoustic waves may degrade detector performance.

After acoustic treatment, detector 11 is released from contact with piezoelectric crystal 46. The method of releasing detector 11 is dependent on the nature of adhesive 44. After release, it may be necessary to clean detector 11 from remnants of adhesive 44.

As is clear to one skilled in the art, the treatment of CdZnTe detector 11 as described hereinabove and in FIG. 3 can be analogously applied to a raw or partially processed CdZnTe crystal that is thereafter fashioned to be a detector.

As is clear to one skilled in the art, the method of the present invention has many advantages for the mass-production of gamma-ray detectors. First, there is less wastage during production. CdZnTe crystals produced according to the methods described in the art that ordinarily are discarded due to poor properties are "repaired" by using the method of the present invention. Second, using the method of the present invention, the properties of CdZnTe crystals are more uniform. As a result, a series of detectors or other devices using CdZnTe crystals made in accordance with the method of the present invention are significantly cheaper as testing and tuning a device made using the CdZnTe crystals is simplified.

Experimental Results

A home-built gamma ray spectrometer of a design substantially as described hereinabove and in FIG. 1 was used in the following experiments. The pulse shaping-amplifier used was a Canberra 2025 supplied by Canberra Industries Inc. (Meriden, Conn.). A computer-equipped multi-channel analyzer was supplied by Oxford Tennelec Nucleous Inc. (Oak Ridge, Tenn.). Further details of the gamma-ray spectrometer used can be found in references [12–15].

Typically the current density amplitude of the ultrasonic transducer was 0.35 mA/cm$^2$ (peak-to-peak) at a shear wave resonant frequency of about 70 kHz. The typical applied field was 1V/cm (peak-to-peak) at resonance and fields as high as 200 V/cm (peak-to-peak) for off-resonance work at 5 kHz were needed to obtain the same in-phase current density as at resonance.

EXAMPLE 1

Reduction of Dark Current, Increased Sensitivity and Resolution

A 1×1×0.2 cm$^3$ CdZnTe detector with a gold backside contact and indium forward pixilated contacts was installed in a gamma-ray spectrometer. The electric field applied was varied between −100 and +100 V while the magnitude of the dark current produced in the CdZnTe detector was measured using a Hewlett Packard 4145 Semiconductor Parameter Analyzer. The magnitude of dark current produced as a function of electric field strength is shown in trace a of FIG. 4A. The detector was used to acquire a gamma-ray spectrum of a Co$^{57}$ sample, FIG. 4B.

The CdZnTe detector was removed from the spectrometer and attached using paraffin to a piezoelectric crystal (0.2× 2.5×5.0 cm$^3$) made from Lead Zirconium Titanate (PZT) ceramic poled in the thin direction supplied by Quartz and Silice (Nemours, France), type P1-60, as described hereinabove and depicted in FIG. 3. A synthetic signal generator Fluke 6010A (John Fluke Mfg. Co. Inc. Seattle, Wash.) was attached to electrodes of the piezoelectric crystal. The frequency generator was used to apply a resonance 63.5 kHz electric field to the piezoelectric crystal at a current intensity of 0.35 mA/cm$^2$ (peak-to-peak). 63.5 kHz was determined to be the resonance frequency (shear waves) of the piezoelectric crystal with the attached CdZnTe crystal. The CdZnTe crystal was subjected to the acoustic vibrations of the piezoelectric crystal for 60 minutes. After acoustic treatment, the CdZnTe detector was detached from the piezoelectric crystal. Traces of paraffin were removed from the CdZnTe detector by heating and rinsing with alcohol.

Figure 4A:
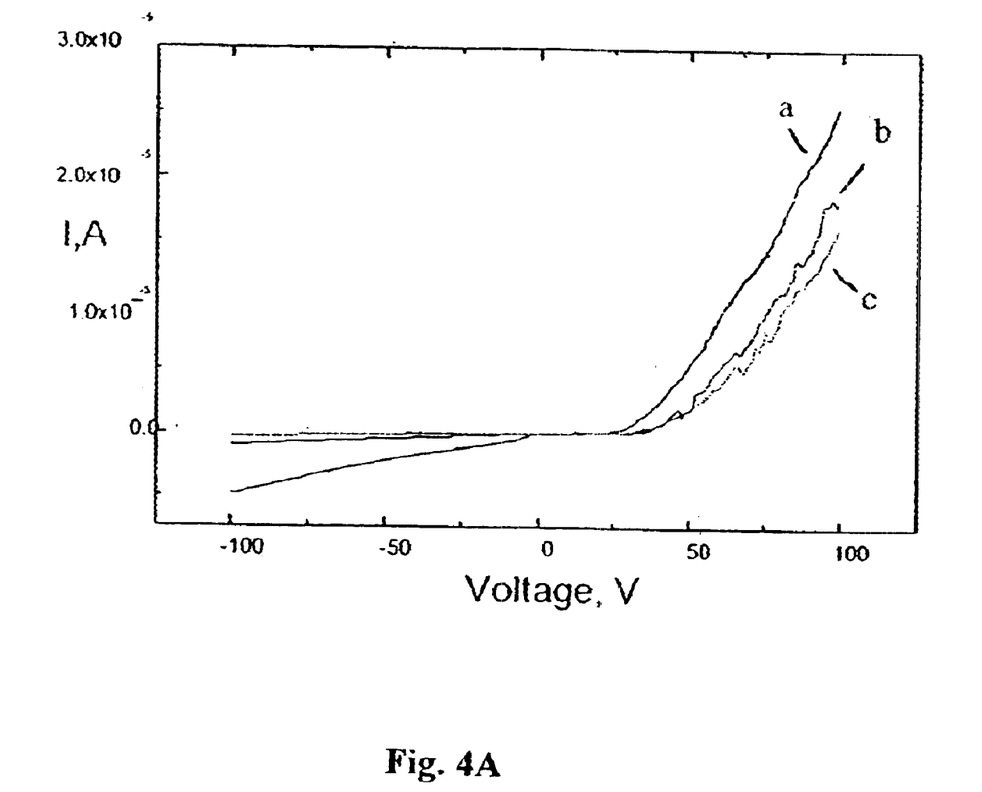
FIG. 4A presents data demonstrating the reduction of dark current produced in a CdZnTe detector as a result of acoustic treatment according to the method of the present invention.

The CdZnTe detector was reinstalled in the gamma ray spectrometer, and the dark current measurement was repeated. Trace b in FIG. 4A shows the reduction in dark current resulting from use of the method of the present invention.

Figure 4B:
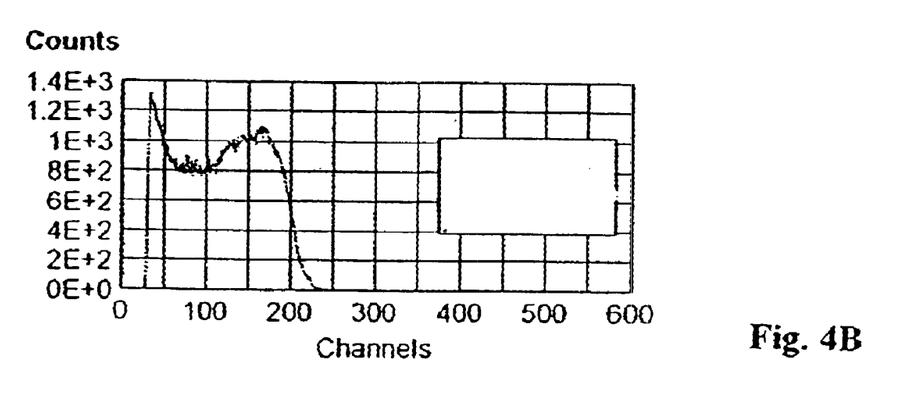
FIG. 4B shows a gamma ray spectrum of a sample of $Co^{57}$ acquired using a CdZnTe detector before being treated according to the method of the present invention.
Figure 4C:
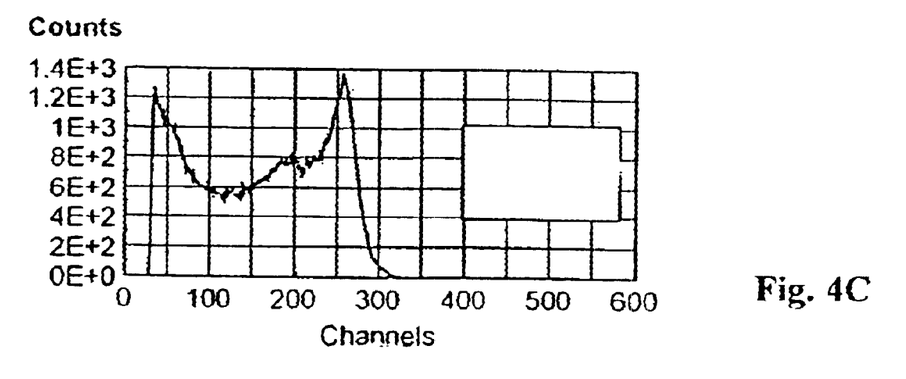
FIG. 4C shows a gamma ray spectrum of a sample of $Co^{57}$ acquired using a CdZnTe detector after being treated according to the method of the present invention.

The CdZnTe detector was again removed from the spectrometer, treated according to the method of the present invention as described hereinabove and reinstalled in the gamma-ray spectrometer. Trace c in FIG. 4A shows an even further reduction in dark current produced. The dark current reduction by the second treatment was much smaller showing the saturation effect. The detector was again used to acquire a gamma-ray spectrum of a Co$^{57}$ sample, FIG. 4C. Traces b and c in FIG. 4A show the reduction of dark current produced by a CdZnTe detector resulting from use of the method of the present invention. Comparison of FIGS. 4B and 4C show the remarkable increase in sensitivity and resolution resulting from use of the method of the present invention, wherein an untreated detector having virtually no sensitivity in the Co$^{57}$ channel (FIG. 4B) becomes useful (FIG. 4C).

EXAMPLE 2

Reduction of Dark Current and Increased Uniformity of Detectors

Five CdZnTe detectors made from the same crystal (Yinnel Tech, Inc., South Bend, Ind.).

The dark current produced by the five detectors was initially measured without a guard ring (FIG. 5A) and with a guard ring (FIG. 5B). The detectors were then treated according to the method of the present invention as described immediately hereinbelow and the dark current produced was again measured without a guard ring (FIG. 5C) and with a guard ring (FIG. 5D).

The crystals were treated at a resonance frequency of 63.5 kHz (shear waves) for 30 minutes at an elevated ambient temperature (60° C.) and with 0.35 mA/cm$^2$ current density. 63.5 kHz was determined to be the resonance frequency of the piezoelectric crystal with the attached CdZnTe crystal.

Figure 5:
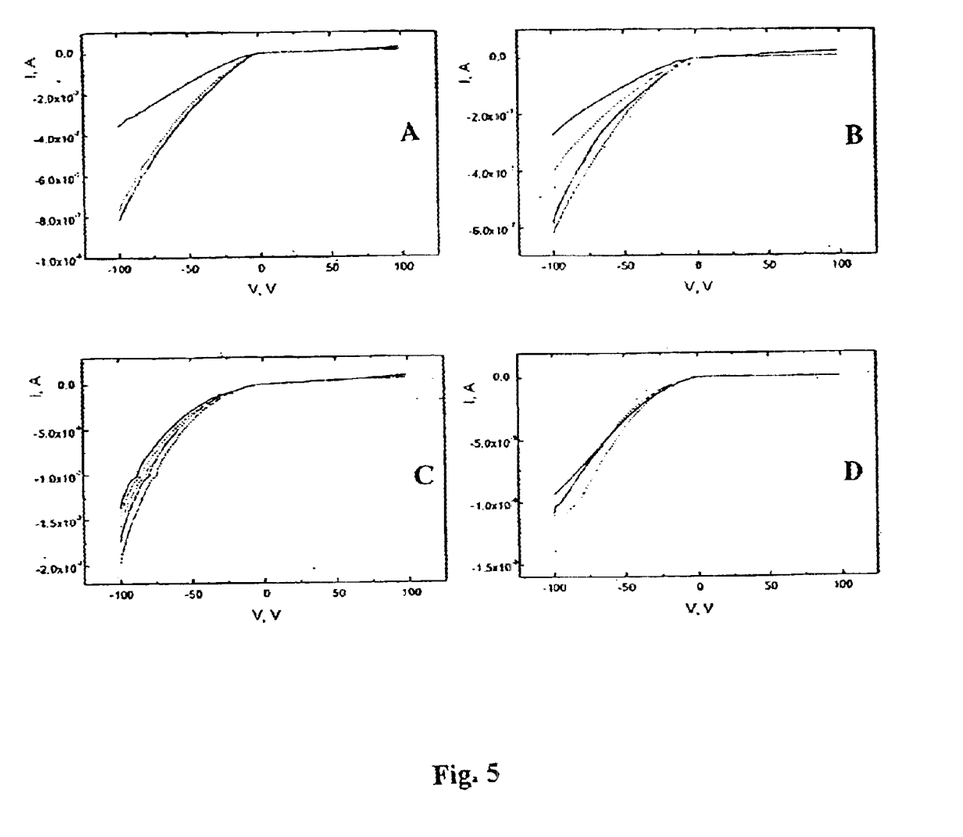
FIG. 5 present data demonstrating the reduction of dark current produced and increased homogeneity of five CdZnTe detector pixels made from the same crystal as a result of acoustic treatment according to the method of the present invention.

As is seen from FIG. 5, the dark current produced decreased by more than an order of magnitude and the difference between the different detector became much smaller resulting from use of the method of the present invention.

EXAMPLE 3

Sensitivity and Resolution Improvement

Figure 6:
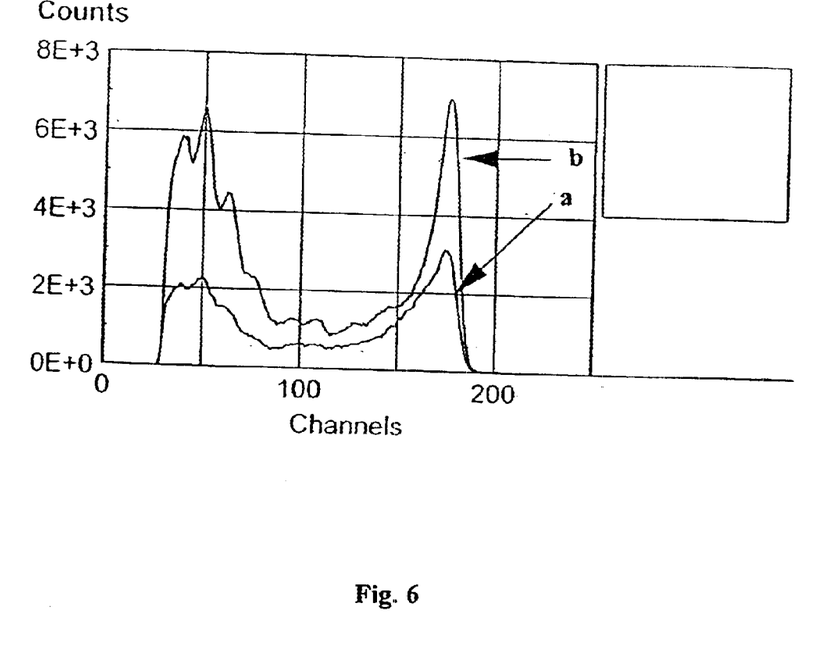
FIG. 6 presents data demonstrating the improved performance of a CdZnTe detector used for the detection of $Am^{241}$ gamma radiation as a result of treatment according to the method of the present invention.

A 1×1×0.2 cm$^3$ CdZnTe detector with a gold backside contact and indium forward pixilated contacts was installed in a gamma ray spectrometer and used to detect the gamma ray spectrum of Am$^{241}$, trace a in FIG. 6. The CdZnTe detector was removed from the spectrometer and attached to the piezoelectric crystal described above in Example 1 using paraffin. The frequency generator was used to apply a 70 kHz electric field to the piezoelectric crystal at a current intensity of 0.70 mA/cm$^2$ (peak-to-peak) for 60 minutes. 70 kHz was determined to be a near yet off-resonance frequency of the piezoelectric crystal with the attached CdZnTe detector.

After acoustic treatment, the CdZnTe detector was detached from the piezoelectric crystal. Traces of paraffin were removed from the CdZnTe detector by heating and rinsing with alcohol. The CdZnTe detector was reinstalled in the gamma ray spectrometer. Trace b in FIG. 6 shows the increased sensitivity, 7×10$^3$ instead of 2.5×10$^3$ and resolution 8.5% instead of 14.4% of the CdZnTe detector resulting from use of the method of the present invention

EXAMPLE 4

Rescue of a Detector

Figure 7:
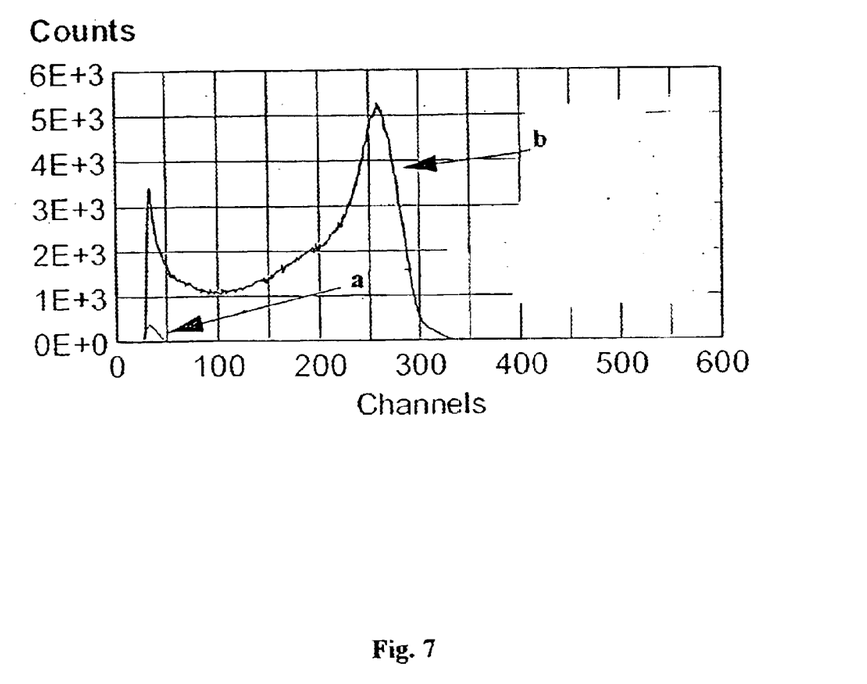
FIG. 7 presents data demonstrating the improved performance of a CdZnTe detector used for the detection of $Co^{57}$ gamma radiation as a result of treatment according to the method of the present invention.

A 1×1×0.2 cm³ CdZnTe detector with a gold backside contact and indium forward pixilated contacts was installed in a gamma ray spectrometer and used to detect the gamma ray spectrum of Co$^{57}$, trace a in FIG. 7. The CdZnTe detector was removed from the spectrometer and attached to the piezoelectric crystal described above in Example 1 using photoresist. The frequency generator was used to apply a 5 kHz electric field to the piezoelectric crystal at an in-phase current intensity of 0.35 mA/cm² (peak-to-peak) for 120 minutes. 5 kHz (compressional waves) was determined to be an off-resonance frequency of the piezoelectric crystal with the attached CdZnTe detector.

After acoustic treatment, the CdZnTe detector was detached from the piezoelectric crystal. Traces of photoresist were removed from the CdZnTe detector by rinsing with acetone. The CdZnTe Detector was reinstalled in the gamma ray spectrometer. Trace b in FIG. 7 shows the recovery of a previously useless CdZnTe detector resulting from use of the method of the present invention While the invention has been described with respect to a limited number of embodiments, it will be appreciated that many variations, modifications and other applications of the invention may be made.

What is claimed is:

1. A method for producing a gamma-ray detector, comprising:
    a) providing a CdZnTe crystal;
    b) providing a device for producing acoustic waves;
    c) applying acoustic waves produced by said device to said CdZnTe crystal; and
    d) integrating said CdZnTe crystal in said gamma ray detector.

2. The method of claim 1 wherein said acoustic waves are applied through a face of said CdZnTe crystal.

3. The method of claim 2 wherein said acoustic waves propagate perpendicularly to said face.

4. The method of claim 1 wherein said device includes a transducer.

5. The method of claim 4 wherein preceding said application of said acoustic waves to said CdZnTe crystal,
    e) said crystal is reversibly attached to said transducer through a face of said CdZnTe crystal.

6. The method of claim 5 further comprising:
    f) determining a resonance frequency of said transducer after said attachment of said CdZnTe crystal;
and wherein said acoustic waves are of a frequency substantially similar to said resonance frequency.

7. The method of claim 1 wherein said acoustic waves have a frequency between 100 Hz and 10 MHz.

8. The method of claim 7 wherein said acoustic waves are ultrasonic.

9. The method of claim 1 wherein said acoustic waves are shear waves.

10. The method of claim 1 wherein said acoustic waves are compressional waves.

11. The method of claim 1 wherein a length of time said acoustic waves are applied is between 10 minutes and 240 minutes.

12. The method of claim 1 wherein a frequency of said acoustic waves is at least 1 MHz and said length of time is less than 20 minutes.

13. The method of claim 1 wherein said application of said acoustic waves to said CdZnTe crystal is performed at room temperature.

14. The method of claim 1 wherein said application of said acoustic waves to said CdZnTe crystal is performed at a temperature of between 20° C. and 80° C.

15. The method of claim 1 wherein after said application of said acoustic waves to said CdZnTe crystal
    e) said crystal is annealed at a temperature of between 30° C. and 90° C.

16. The method of claim 15 wherein said annealing is performed for more than 30 minutes.

17. The method of claim 15 wherein said annealing is performed for less than 2 months.

18. The method of claim 1 wherein subsequent to said application of said acoustic waves to said CdZnTe crystal
    e) surfaces of said crystal are treated so as to remove defects appearing at said surfaces.

19. The method of claim 18 wherein said treatment of said surfaces includes etching using a methanolic solution of Br$_2$.

20. The method of claim 1 wherein said device is configured to transmit said acoustic waves to said CdZnTe crystal through a liquid and wherein preceding said application of said acoustic waves to said CdZnTe crystal
    e) said crystal is immersed in said liquid.

21. The method of claim 1 further comprising:
    e) providing a DC electric field
and wherein said CdZnTe crystal is within said electric field during said application of said acoustic waves to said CdZnTe crystal.

22. The method of claim 21 wherein said DC electric field has an intensity greater than 50 V/cm.

23. The method of claim 21 wherein said DC electric field has an intensity of less than 500 V/cm.

24. A method for improving the performance of a gamma-ray detector, the gamma ray including a CdZnTe crystal with attached contacts, comprising:
    a) providing a device for producing acoustic waves; and
    b) applying acoustic waves produced by said device to the CdZnTe crystals.

25. The method of claim 24 wherein said acoustic waves are applied through a face of the CdZnTe crystal.

26. The method of claim 25 wherein said acoustic waves propagate perpendicularly to said face.

27. The method of claim 24 wherein said device includes a transducer.

28. The method of claim 27 wherein preceding said application of said acoustic waves to the CdZnTe crystal,
    c) the crystal is reversibly attached to said transducer through a face of the CdZnTe crystal.

29. The method of claim 28 further comprising:
    d) determining a resonance frequency of said transducer after said attachment of the CdZnTe crystal;
and wherein said acoustic waves are of a frequency substantially similar to said resonance frequency.

30. The method of claim 24 wherein said acoustic waves have a frequency between 100 Hz and 10 MHz.

31. The method of claim 24 wherein said acoustic waves are ultrasonic.

32. The method of claim 24 wherein said acoustic waves are shear waves.

33. The method of claim 24 wherein said acoustic waves are compressional waves.

34. The method of claim 24 wherein a length of time said acoustic waves are applied is between 10 minutes and 240 minutes.

35. The method of claim 24 wherein a frequency of said acoustic waves is at least 1 MHz and said length of time is less than 20 minutes.

36. The method of claim 24 wherein said application of said acoustic waves to the CdZnTe crystal is performed at room temperature.

37. The method of claim 24 wherein said application of said acoustic waves to the CdZnTe crystal is performed at a temperature of between 20° C. and 80° C.

38. The method of claim 24 wherein after said application of said acoustic waves to the CdZnTe crystal c) the crystal is annealed at a temperature of between 30° C. and 90° C.

39. The method of claim 38 wherein said annealing is performed for more than 30 minutes.

40. The method of claim 38 wherein said annealing is performed for less than 2 months.

41. The method of claim 24 wherein subsequent to said application of said acoustic waves to the CdZnTe crystal c) surfaces of the crystal are treated so as to remove defects appearing at said surfaces.

42. The method of claim 41 wherein said treatment of said surfaces includes etching using a methanolic solution of $Br_2$.

43. The method of claim 24 wherein said device is configured to transmit said acoustic waves to the CdZnTe crystal through a liquid and wherein preceding said application of said acoustic waves to the CdZnTe crystal d) the crystal is immersed in said liquid.

44. The method of claim 24 further comprising:

d) providing a DC electric field and wherein the CdZnTe crystal is within said electric field during said application of said acoustic waves to the CdZnTe crystal.

45. The method of claim 44 wherein said DC electric field has an intensity greater than 50 V/cm.

46. The method of claim 44 wherein said DC electric field has an intensity of less than 500 V/cm.

* * * * *